(12) United States Patent
Chen et al.

(10) Patent No.: US 8,741,552 B2
(45) Date of Patent: *Jun. 3, 2014

(54) DOUBLE PATTERNING STRATEGY FOR CONTACT HOLE AND TRENCH IN PHOTOLITHOGRAPHY

(75) Inventors: Chun-Kuang Chen, Hsinchu Hsien (TW); Hsiao-Wei Yeh, Jhudong Township (TW); Chih-An Lin, Chong-He (TW); Chien-Wei Wang, Wufong Township (TW); Feng-Cheng Hsu, Sanxia (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 337 days.

This patent is subject to a terminal disclaimer.

(21) Appl. No.: 12/702,737

(22) Filed: Feb. 9, 2010

(65) Prior Publication Data
US 2010/0310995 A1    Dec. 9, 2010

Related U.S. Application Data

(60) Provisional application No. 61/151,734, filed on Feb. 11, 2009.

(51) Int. Cl.
*G03F 7/26* (2006.01)

(52) U.S. Cl.
USPC .............. 430/323; 430/330; 430/394

(58) Field of Classification Search
USPC .......... 430/311, 313, 315, 322, 324, 329
See application file for complete search history.

(56) References Cited

U.S. PATENT DOCUMENTS

| | | | |
|---|---|---|---|
| 5,667,940 A * | 9/1997 | Hsue et al. | 430/312 |
| 7,935,477 B2 | 5/2011 | Hsu et al. | |
| 8,048,616 B2 * | 11/2011 | Hsu et al. | 430/323 |
| 8,450,052 B2 | 5/2013 | Hsu et al. | |
| 2008/0064213 A1 * | 3/2008 | Jung | 438/696 |

FOREIGN PATENT DOCUMENTS

| | | |
|---|---|---|
| CN | 101145515 | 3/2008 |
| CN | 101533218 | 9/2009 |

* cited by examiner

*Primary Examiner* — Kathleen Duda
(74) *Attorney, Agent, or Firm* — Haynes and Boone, LLP

(57) ABSTRACT

A method of lithography patterning includes forming a first resist pattern on a substrate, wherein the first resist pattern including a plurality of openings. A second resist pattern is formed on the substrate and within the plurality of openings of the first resist pattern, wherein the second resist pattern includes at least one opening therein on the substrate. The first resist pattern is removed to uncover the substrate underlying the first resist pattern.

21 Claims, 5 Drawing Sheets

DOUBLE PATTERNING STRATEGY FOR CONTACT HOLE AND TRENCH IN PHOTOLITHOGRAPHY

CROSS-REFERENCE

The present application claims priority to U.S. Provisional Application Ser. No. 61/151,734, filed on Feb. 11, 2009, which is incorporated herein by reference in its entirety. The present disclosure is related to the following commonly-assigned U.S. patent applications, the entire disclosures of which are incorporated herein by reference: U.S. application Ser. No. 11/948,444 filed Nov. 30, 2007 by inventors Feng-Cheng Hsu and Chun-Kuang Chen for "DOUBLE PATTERNING STRATEGY FOR CONTACT HOLE AND TRENCH IN PHOTOLITHOGRAPHY", which is now U.S. Pat. No. 7,935,477, and U.S. application Ser. No. 12/047,086 filed Mar. 12, 2008 by inventors Feng-Cheng Hsu and Chun-Kuang Chen for "DOUBLE PATTERNING STRATEGY FOR CONTACT HOLE AND TRENCH IN PHOTOLITHOGRAPHY", which is now U.S. Pat. No. 8,048,616.

BACKGROUND

Semiconductor technologies are continually progressing to smaller feature sizes, for example down to feature sizes of 65 nanometers, 45 nanometers, and below. A patterned photoresist (resist) layer used to produce such small feature sizes typically has a high aspect ratio and maintaining a desired critical dimension (CD) can be very difficult, especially for a resist layer with a high aspect ratio. Double patterning processes have been introduced to form various features with smaller dimensions. However, conventional double patterning processes involve multiple etching processes with high manufacturing cost and low throughput.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
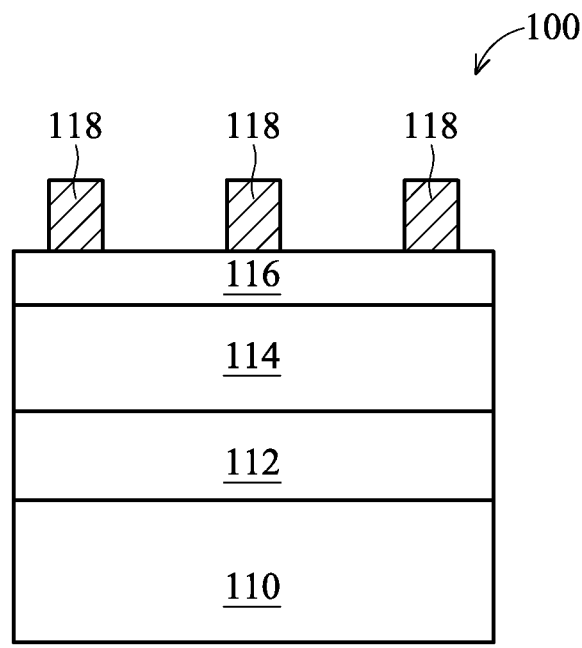
FIGS. 1 through 9 are sectional views of one embodiment of a semiconductor device during various fabrication stages.

It is understood that the following disclosure provides many different embodiments, or examples, for implementing different features of various embodiments. Examples of components and arrangements are described below to simplify the present disclosure and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 10:
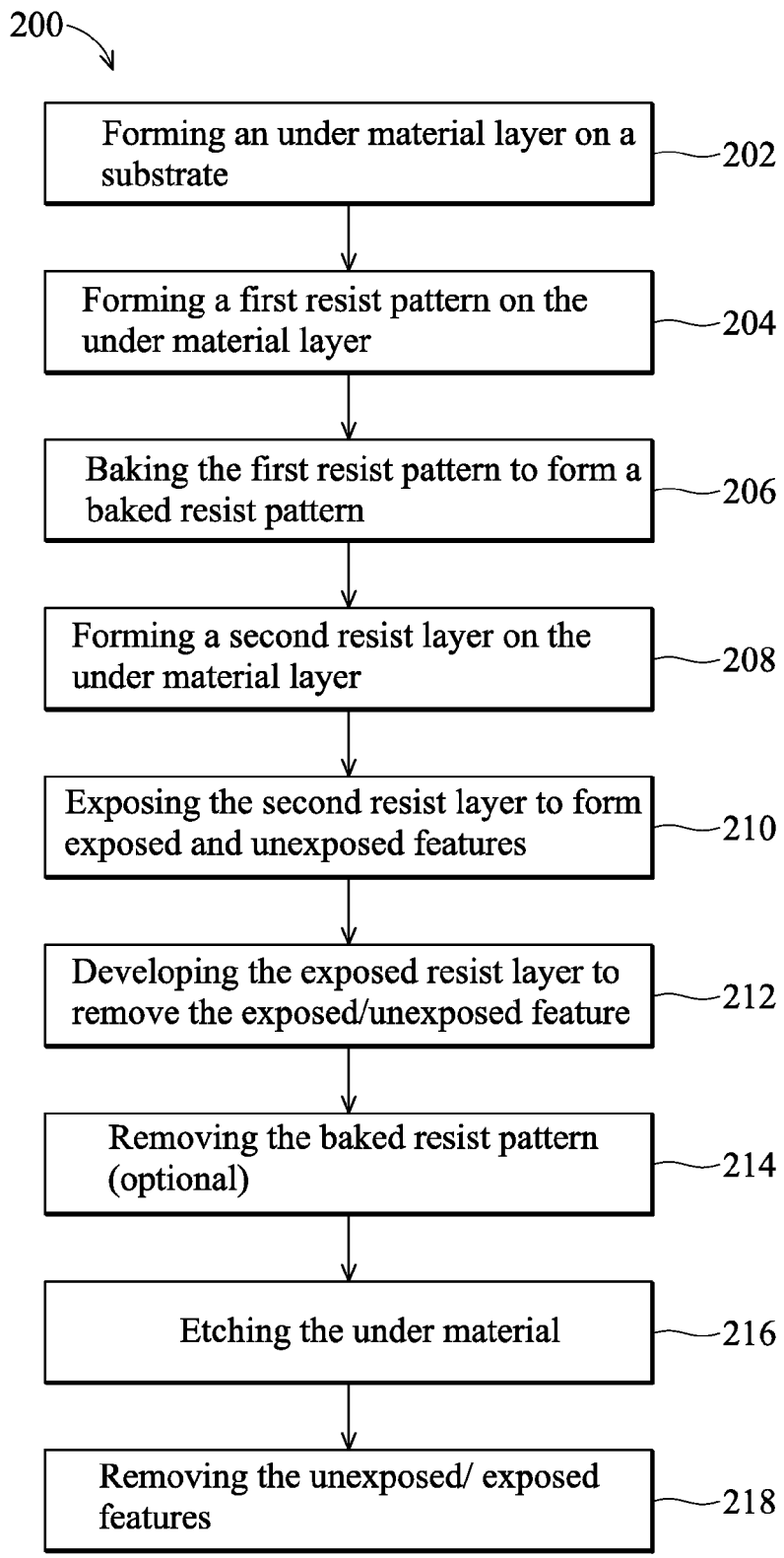
FIG. 10 is a flowchart showing one embodiment of a lithography patterning method.

Referring to FIGS. 1 and 10, in one embodiment, the method 200 begins at step 202 by forming one or more underlying material layer (also referred to as an "under-material" layer) on the substrate 110. The substrate 110 may be made of silicon, some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, in other embodiments, the substrate 110 includes a non-semiconductor material such as a glass for thin-film-transistor liquid crystal display (TFT-LCD) devices, or fused quartz or calcium fluoride for a photomask (mask). Still further, in other embodiments, the substrate 110 may include various doped regions, dielectric features, and multilevel interconnects. In one embodiment, the substrate 110 includes various doped features for various microelectronic components, such as a complementary metal-oxide-semiconductor field-effect transistor (CMOSFET), imaging sensor, memory cell, and/or capacitive element. In another embodiment, the substrate 110 includes conductive material features and dielectric material features configured for coupling and isolating various microelectronic components, respectively. In another embodiment, the substrate 110 includes one or more material layers formed thereon.

In some embodiments, the under-material layer may be a single material or layers of different materials. In the embodiment shown in FIGS. 1-9, a material layer 112 is formed on the substrate 110. In at least one embodiment, material layer 112 is a dielectric material, such as silicon oxide and/or low dielectric-constant (low-k) material. In other embodiments, the material layer 112 includes silicon, poly-silicon, dielectric material, conductive material or combinations thereof. In some embodiments material layer 112 has a thickness ranging between about 100 angstroms and about 9000 angstroms. For example, in at least one embodiment, the material layer 112 has a thickness ranging between about 1000 angstroms and 3500 angstroms. In one embodiment, the material layer 112 serves as an interlayer dielectric (ILD) or inter-metal dielectric (IMD). The dielectric materials used for ILD or IMD includes silicon oxide and low-k dielectric materials with a dielectric constant less than about 4. Suitable low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other proper porous polymeric materials. Non limiting, the dielectric material is formed by spin-on coating, chemical vapor deposition (CVD), or other suitable process.

In at least one embodiment, a mask layer 114 may be formed on the material layer 112. In the present embodiment, the mask layer 114 includes silicon nitride, silicon oxynitride, or other suitable material film formed by a suitable process, such as CVD deposition. In some embodiments, the mask layer 114 has a thickness ranging between about 50 angstroms and about 1000 angstroms, and is configured to function as a hard mask during a later etching process for patterning the material layer 112 and/or the substrate 110.

Additionally, in at least one embodiment, an anti-reflective coating (ARC) layer 116 is formed on the mask layer 114 to reduce reflection during lithography exposing processes, also referred to as a top anti-reflective coating (TARC) layer or bottom anti-reflective coating (BARC) layer. In one example, the ARC layer includes organic BARC material formed by a spin-coating technique. In some embodiments, the ARC layer 116 has a thickness ranging from about 50 angstroms to about 2000 angstroms. In other embodiments, the ARC layer 116 is eliminated when the mask layer 114 can function both as a mask layer and an anti-reflective layer. In various embodiments, different combinations of the provided material layers or a subset thereof may be used as the under material layer in various applications.

Still referring to FIGS. 1 and 10, the method 200 proceeds to step 204 by forming a first resist pattern 118 on the ARC layer 116. The first resist pattern 118, in one embodiment, is a positive tone resist (positive resist) pattern formed by exposing and developing a first positive resist layer. In another embodiment, the first resist pattern 118 is a negative tone resist (negative resist) pattern formed by exposing and developing a first negative resist layer. Preferably, the first resist pattern 118 is a positive resist pattern. The positive resist is characterized as that the exposed regions will be removed by the developing solution. In one embodiment, the positive resist pattern 118 includes chemical amplifier (CA) resist. The CA resist includes photoacid generator (PAG) that can be decomposed to form acid during a lithography exposure process. More acid can be generated as a result of catalytic reaction.

As one example of the formation, the first positive resist layer is formed on the semiconductor device 100 and then patterned by a first lithography process to form the positive resist pattern 118, as illustrated in FIG. 1. The resist material of the first positive resist pattern 118 is characterized as that it is insoluble in another resist material and is soluble in developer solvent after a hard baking process. In one embodiment, the resist material of the first positive resist pattern 118 further comprises a thermal-acid generator that can generate more acid during the subsequent baking process. In another embodiment, the resist material of the first positive resist pattern 118 further comprises a cross-linker that can induce cross-linking reaction during the subsequent baking process. In another embodiment, the resist material of the first positive resist pattern 118 comprises some additives, such as surfactant or high-dissolution agent, which can inhibit the dissolution in another resist material and can increase the dissolution in a developer of a developing process after the subsequent baking process.

The first positive resist pattern 118 includes a plurality of positive resist features and a plurality of openings defined by the positive resist features, such that portions of the under material layer within the openings are uncovered.

The first lithography process uses a lithography system and a first mask. The openings of the first positive resist pattern 118 are formed according to a predetermined integrated circuit pattern in the first mask. In one embodiment, the positive resist features include a pitch p, defined as a distance from one feature to adjacent feature of the first resist pattern. In some embodiments, the pitch p ranges between about 50 nm and about 200 nm. In one embodiment, the pitch is about 100 nm. Non-limiting, the first resist pattern 118 has a thickness ranging between about 500 angstroms and 5000 angstroms. In various embodiments, the first resist pattern 118 has a thickness ranging between about 500 angstroms and 3000 angstroms, or between about 500 angstroms and 1500 angstroms. In some embodiments, the first lithography process used to form the first positive resist pattern 118 includes resist coating, exposing, post-exposure baking, and developing. In addition, according to other embodiments, the first lithography process additionally includes soft baking, mask aligning, and/or hard baking. For example, in at least one embodiment, the exposing process is carried out by exposing the semiconductor device 100 under a radiation beam through the first mask.

Figure 2:
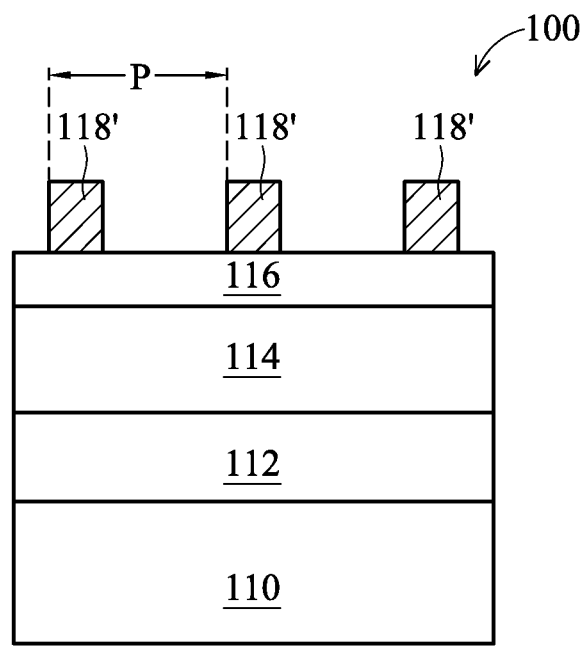

Referring to FIGS. 2 and 10, the method 200 proceeds to step 206 to include a post-exposure baking (or resist baking) process applied to the first positive resist pattern 118 before the formation of the second resist layer 120. The baking process is designed to harden the first positive resist pattern 118 and prevent it from being deformed by a later lithography process to form the second resist pattern. In one embodiment, the baking process includes thermal curing. In other embodiments, the curing process comprises one or more of ultraviolet (UV) curing, ion implant bombardment, and e-beam treatment. The first positive resist pattern 118 is transformed to a baked resist pattern 118' after the baking process. In one embodiment, the baking time is ranged from about 20 sec to about 200 sec. The baking temperature is chosen such that the baked resist pattern 118' is soluble in developer, while insoluble in a second resist layer. In one embodiment, the baking temperature is ranged from about 100° C. to about 250° C. In another embodiment, the baking temperature is ranged from about 150° C. to about 250° C.

Figure 3:
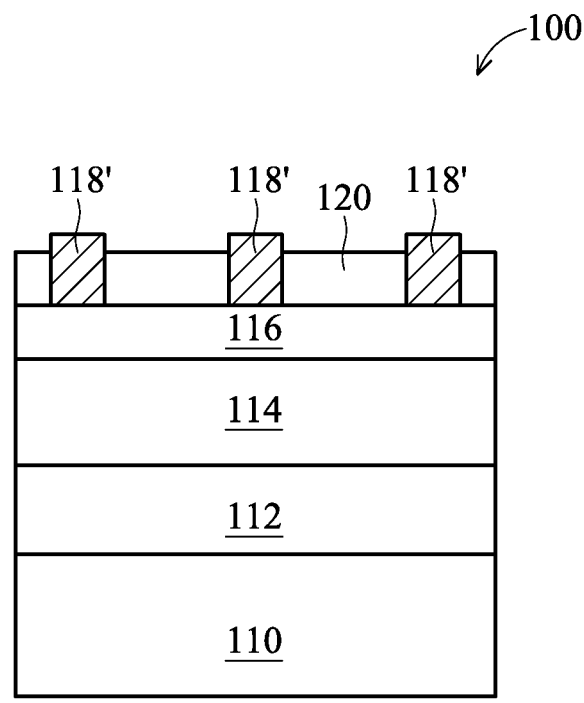

Referring to FIGS. 3 and 10, the method 200 proceeds to step 208 by forming the second resist layer 120 on the device 100. In one embodiment, the second resist layer 120 is a positive resist layer. In another embodiment, the second resist layer 120 is a negative resist layer. In at least one embodiment, the second resist layer 120 is a positive resist layer. In one example, the second resist layer 120 is formed on the under material layer overlying the substrate 110 and within the openings defined by the baked resist pattern 118'. The second resist layer 120 is coated on the device 100 such that the top surface of the second resist layer 120 is lower than that of the baked resist pattern 118' and the baked resist pattern 118' is uncovered by the second resist layer 120. In one embodiment, the second resist to be coated is tuned with a high enough surface tension so that the top surface of the second resist layer is not formed on the top surface of the baked resist pattern 118'. In another embodiment, the speed of the spin-on coating is tuned to a high enough level such that the top surface of the baked resist pattern 118' is uncovered by the second resist layer 120.

Figure 4:
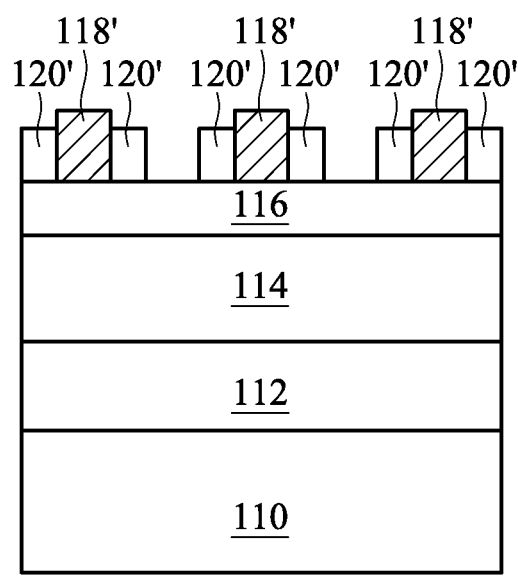

Referring to FIGS. 4 and 10, the method 200 proceeds to steps 210 and 212 to pattern the second resist layer 120 with a second lithography process. In the second lithography process, the second resist layer 120 is exposed using a second mask with a second predefined pattern and a lithography system. A plurality of exposed resist features and unexposed resist features (not shown) are formed in the second resist layer 120 by the second exposing process. The exposed resist features are then removed by a subsequent developing process if the second resist layer 120 is a positive resist layer. In one embodiment, the baked resist pattern 118' is not removed by the developing process.

FIG. 4 shows the portions of second resist layer 120 remaining after the developing step, which correspond to unexposed resist features 120' and the baked resist pattern 118' left on the ARC layer 116. In another embodiment, the baked resist pattern 118' is removed by the developing process and only the unexposed resist features left on the ARC layer 116 (FIG. 5).

In one example, the unexposed resist features are periodically configured and have a pitch ranging between about 50 nm and about 200 nm. In one embodiment, each of the exposed resist features is positioned to horizontally enclose one feature of the baked resist pattern 118'. In some embodiments, the second lithography process further includes post-exposure baking, developing, and hard baking, wherein the ARC layer 116 is partially uncovered after the second positive resist layer 120 is exposed and developed.

Figure 5:
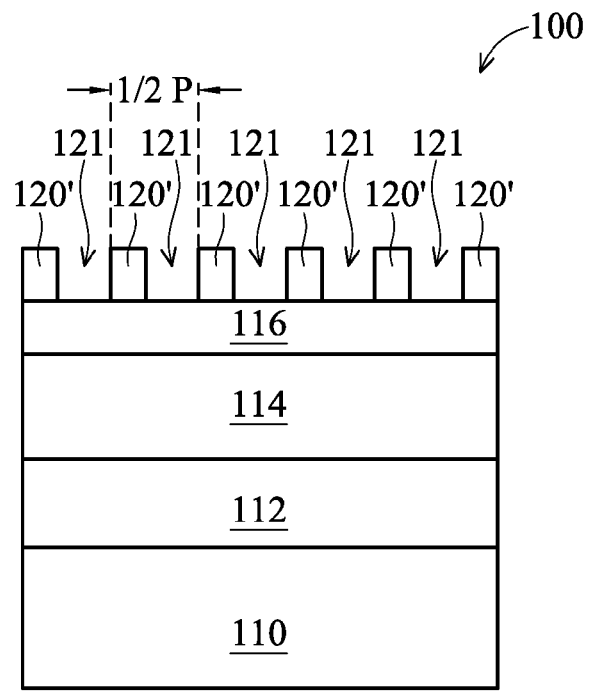

Referring to FIGS. 5 and 10, the method 200 proceeds to step 214 to remove the baked resist pattern 118' if it is not removed during developing process. In one embodiment, a proper solvent may be chosen such that the baked resist pattern 118' is soluble in the solvent while the unexposed resist features 120' are insoluble in the solvent. Therefore, by applying the solvent, the baked resist pattern 118' is removed while the unexposed resist features 120' remains. In one example, an organic solvent is applied to the semiconductor device 100 to selectively remove the baked resist pattern 118'. In another example, the baked resist pattern 118' is intrinsically removed by the developing process implemented at step 212. In this example, the step 214 is eliminated and the removing the baked resist pattern 118' is achieved at step 212. Therefore, the removal of the baked resist pattern 118' and the patterning of the second positive resist layer are completed in one step. After the removal of the baked resist pattern 118', various openings 121 are formed in the unexposed resist features 120' as illustrated in FIG. 5. The openings 121 are collectively defined by the first mask and the second mask and formed in the various processes described above.

The unexposed resist features 120' are configured relative to the baked resist pattern 118' so to utilize a double patterning structure. In one embodiment, the formed openings 121 in the unexposed resist features 120' are configured to achieve pitch splitting, and the pitch may be about 100 nm. In another embodiment, the baked resist pattern 118' and the unexposed resist features 120' are configured to have a split pitch as half of the pitch of the first positive or negative resist pattern. The pitch defined by the openings 121 is halved, resulting in a reduced minimum features size. The openings 121 thus formed are used to further form various contact holes or trenches in different applications.

Figure 6:
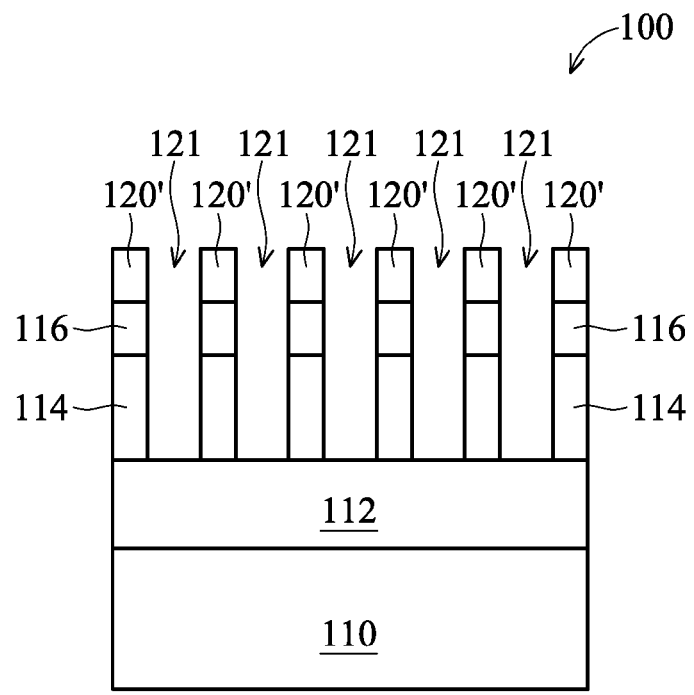

Referring to FIGS. 6 and 10, the method 200 proceeds to step 216 by etching the underlying material layer. The mask layer 114 within the openings 121 is uncovered by the unexposed resist features 120' and is removed in the etching process, transferring the openings 121 defined in the second positive resist layer 120 into the mask layer 114. The etching process is chosen such that the mask layer 114 has a higher etch rate than that of the second positive resist layer 120. Therefore, the mask layer within the openings 121 is substantially removed during the etching process. In one example, the ARC layer 116 within the openings 121 is removed during the etching process at this step. In another example, the ARC layer 116 within the openings 121 is removed at step 214 by the solvent to remove the baked resist pattern 118'.

Figure 7:
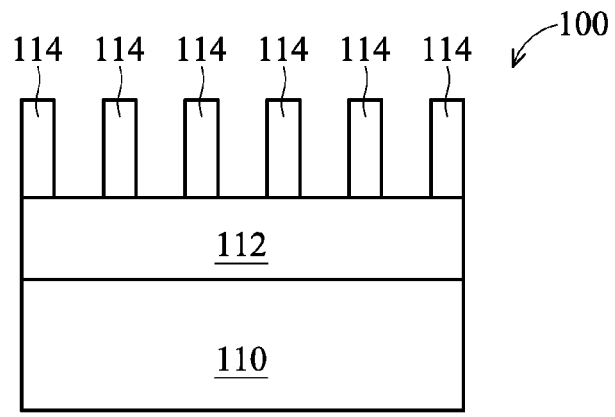

Referring to the embodiments depicted in FIGS. 7 and 10, the method 200 proceeds to step 218 wherein the unexposed resist features 120' are removed after etching the underlying material layer within the openings 121 defined in the second positive resist layer 120. In one embodiment, step 218 implements a wet stripping or plasma ashing known in the art to remove the unexposed resist features 120'. For example, in one embodiment, an oxygen plasma ashing is implemented to remove the unexposed resist features 120'. Additionally, in at least one embodiment, the ARC layer 116 is simultaneously removed with the unexposed resist features 120' by the same plasma ashing process.

Figure 8:
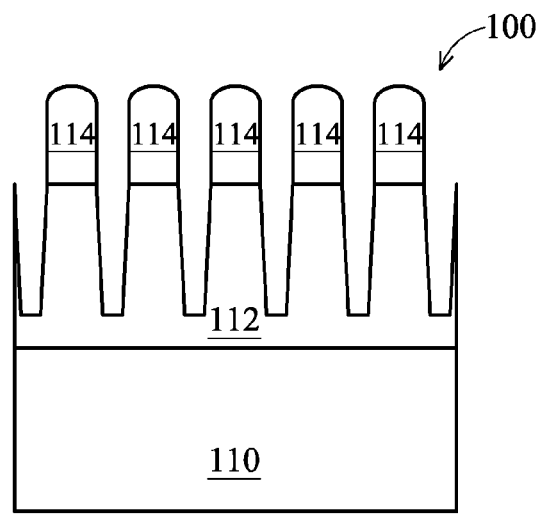
Figure 9:
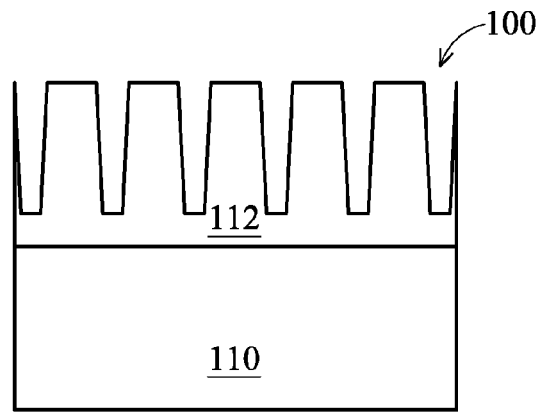

In at least one embodiment, the material layer 112 is etched using the patterned mask layer 114 as a hard mask to transfer the defined openings from the mask layer 114 to the material layer 112, as illustrated in FIG. 8 in a sectional view. The material layer 112 is thus patterned to form a plurality of trenches or contact holes. In some embodiments the etching process includes a dry etch, a wet etch, or a combination of wet and dry etches. The mask layer 114 is used as a hard mask at this step and therefore has a higher etching resistance relative to that of the material layer 112. In some embodiments, the dry etch utilizes a proper etch gas, such as HBr, $Cl_2$, $SF_6$, $O_2$, Ar, and/or He. The mask layer 114 could be partially consumed during the etching process. The remainder of the mask layer 114 is thereafter removed, as illustrated in FIG. 9.

The method described above with reference to FIGS. 1 to 10 provides a double patterning process constructed according to various aspects of the present disclosure. This method achieves double exposures and a single etching process to the underlying material layer or the substrate, therefore reducing the manufacturing cost and minimizing CD variation. Other advantages are present in different embodiments and/or applications. For example, the dimensional changes of the IC features (such as contact holes or metal lines) associated with the overlay error of the existing double patterning process are eliminated. In another example, since only one etching process is used to etch the under material layer, the manufacturing cost is reduced. The manufacturing throughput and product quality are enhanced, compared with the conventional double patterning and double etching method. In another example, the method 200 is capable of etching a thicker film since the mask layer 114 can be properly chosen with a higher etch resistance.

Various embodiments of a lithography patterning method 200 have been introduced and described. Other embodiments include modifications, variations, additions, and extensions without departing from the scope of the disclosure. In one embodiment, for example, a plurality of contact holes are defined by the first positive and second positive resist patterns are formed in the material layer 112. Alternatively, in other embodiments, a plurality of trenches is defined by the first positive and second positive resist patterns formed in the material layer 112. In another embodiment, the BARC layer 116 and/or mask layer 114 is eliminated. In another example, the positive and negative resist patterns are directly formed on the substrate 110.

In some embodiments, the radiation beam used to expose the first and second resist layers is ultraviolet (UV) or extreme ultraviolet (EUV), such as a 248 nm beam from a Krypton Fluoride (KrF) excimer laser, or a 193 nm beam from an Argon Fluoride (ArF) excimer laser. In other embodiments, the lithography process utilizes other exposing modes or technologies, such as on-axis, off-axis, quadripole, or dipole exposure technologies. Alternatively, the optical exposing process is implemented or replaced by other proper methods such as maskless lithography, electron-beam writing, ion-beam writing, and molecular imprint techniques. In another example, the first and second masks used in the method 200 may utilize other mask technologies. For example, the first pattern (or second mask pattern) is formed in a phase shift mask (PSM), which under some circumstances prints better images than a binary mask.

In one embodiment, the positive resist pattern includes chemical amplifier (CA) resist. In another embodiment, the negative resist layer includes negative resist inert to acid. In furtherance of the embodiment, the negative resist layer includes cyclized synthetic rubber resin, bis-acrylazide, and aromatic solvent. In another embodiment, the positive resist alternatively includes novolac resin, diazonaphthoquinone (DNQ) as photoacitve compound (PAC), and PGME (or PGMEA or ethyl lactate) as solvent. In another example, the negative resist includes silicon-containing material such that the negative resist has an etching resistance greater than that of the positive resist.

As noted earlier in one embodiment, the removing process of the first positive resist pattern at step 214 is combined with the step 212. For example, the developing solution used to develop the second resist layer can be tuned or designed to simultaneously remove the first positive resist pattern.

In another example, the first positive resist pattern 118 is alternatively or additionally coated to protect and strengthen the positive resist features. For example, in one embodiment, the first positive resist pattern 118 is coated by a polymeric material. For furtherance of the example, a BARC material is used to coat the first positive resist features 118, wherein the coated BARC layer has a thickness ranging between about 50 angstroms and about 500 angstroms.

Thus the present disclosure provides a method of lithography patterning. The method includes forming a first resist pattern on a substrate, the first resist pattern having a plurality of openings therein on the substrate; baking the first positive resist pattern to form a baked resist pattern; and forming a second resist layer on the substrate and within the plurality of openings of the baked resist pattern, wherein the baked resist pattern is insoluble in the second positive resist layer.

In one embodiment the first resist pattern includes a positive tone resist material and the second resist pattern comprises a positive tone resist material. The second positive resist material is, in at least one embodiment, the same as the first positive resist material, in other embodiments, the second positive resist material is different from the first positive resist material. In some embodiments, the first resist pattern includes an etch rate higher than that of the second resist pattern in an etching process, and removing of the first resist pattern includes applying an etching process to selectively remove the first resist pattern relative to the second resist pattern. In some embodiments, removing of the first resist pattern includes applying a solvent to dissolve the first resist pattern, and includes applying a solvent in which the first resist pattern is soluble and the second resist pattern is insoluble. In some embodiments, the method further includes etching the substrate within various openings of the second resist pattern after the removing of the first resist pattern. In some embodiments, the etching of the substrate includes etching the substrate to form at least one of a plurality of contact holes and a plurality of trenches in the substrate.

The present disclosure also provides another embodiment of a method of double patterning. The method includes forming a first positive resist pattern on a substrate, the first positive resist pattern is formed by a first positive resist layer having a plurality of openings therein, and the first positive resist layer comprises thermal-acid generator, cross-linker, or high-dissolution agent; baking the first positive resist pattern to form a baked resist pattern; forming a second positive resist layer on the substrate and within the plurality of openings of the baked resist pattern; exposing the second positive resist layer to form a plurality of exposed resist features and a plurality of unexposed resist features on the substrate; and forming a second resist pattern by providing a developer solvent to remove the baked resist pattern and the exposed features, leaving the unexposed features.

In this method, the removal of the baked resist pattern and the exposed feature are achieved by applying of a developer solvent. In some embodiments, forming of the second resist layer includes applying a spin-on coating process that includes tuning spin speed to form the negative resist layer thinner than that of the first resist pattern. The applying of the spin-on coating process includes, in at least one embodiment, coating a layer of negative resist with a tuned surface tension such that the second resist layer is thinner than that of the first resist pattern.

In various embodiments, the substrate includes a semiconductor material layer that further includes a dielectric material layer formed on the semiconductor material layer. In some embodiments, the method further includes etching the substrate through the plurality of openings defined by the negative resist pattern.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography patterning method, comprising:
    forming a first resist pattern on a substrate, the first resist pattern having a plurality of openings therein;
    baking the first resist pattern to form a baked resist pattern;
    thereafter, forming a second resist layer on the substrate and within the plurality of openings of the baked resist pattern, wherein the baked resist pattern is insoluble in the second resist layer;
    patterning the second resist layer to form a second resist pattern by a lithography process; and
    removing the baked resist pattern; and
    thereafter, etching the substrate using the second resist pattern as an etch mask.

2. The method of claim 1, wherein the first resist pattern is formed by a first positive resist layer having thermal acid generator, cross-linker, surfactant or high-dissolution agent therein.

3. The method of claim 1, wherein the second resist layer is a second positive resist layer.

4. The method of claim 1, wherein the patterning of the second resist layer to form a second resist pattern by a lithography process includes:
    exposing the second resist layer, to define a plurality of exposed and unexposed features on the substrate; and
    applying a chemical to remove the baked resist pattern and the exposed features, leaving the unexposed features on the substrate.

5. The method of claim 1, wherein the patterning of the second resist layer to form a second resist pattern by a lithography process includes:
    exposing the second resist layer, to define a plurality of exposed and unexposed features on the substrate;
    applying a developer solvent to remove the exposed features, leaving the unexposed features on the substrate; and
    applying an etching process to selectively remove the baked resist pattern relative to the unexposed features.

6. The method of claim 1, wherein a top surface of the second resist layer is lower than a top surface of the baked resist pattern.

7. The method of claim 6, wherein the forming of the second resist layer includes coating the second resist layer that is tuned with a high enough surface tension so that the second resist layer is not formed on the top surface of the baked resist pattern.

8. The method of claim 6, wherein the forming of the second resist layer includes spin-on coating the second resist layer with spin rate tuned to a high enough level such that the top surface of the baked resist pattern is not covered by the second resist layer.

9. A lithography patterning method, comprising:
forming a first resist pattern on a substrate, the first resist pattern having a plurality of openings therein;
baking the first resist pattern to form a baked resist pattern;
thereafter, forming a second resist layer on the substrate and within the plurality of openings of the baked resist pattern;
exposing the second resist layer according to a predefined pattern to form at least one exposed feature and at least one unexposed feature on the substrate; and
forming a second resist pattern by removing the baked resist pattern and the exposed feature, leaving the unexposed feature on the substrate.

10. The method of claim 9, wherein the first resist pattern is formed by a first positive resist layer having thermal-acid generator, cross-linker, surfactant, or high-dissolution agent therein.

11. The method of claim 9, wherein the baked resist pattern is insoluble in the second resist layer.

12. The method of claim 9, wherein the baked resist pattern and the exposed feature are removed by a developer solvent.

13. The method of claim 9, wherein the forming of the second resist layer includes coating the second resist layer that is tuned with a high enough surface tension so that the top surface of the second resist layer is not formed on the top surface of the baked resist pattern.

14. The method of claim 9, wherein the forming of the second resist layer includes spin-on coating the second resist layer with spin rate tuned to a high enough level such that the top surface of the baked resist pattern is uncovered by the second resist layer.

15. A lithography patterning method, comprising:
forming a first resist pattern on a substrate, wherein the first positive resist pattern is formed by a first positive resist layer having a plurality of openings therein, and the first positive resist layer comprises thermal-acid generator, cross-linker, surfactant, or high-dissolution agent;
baking the first positive resist pattern to form a baked resist pattern;
thereafter, forming a second resist layer on the substrate and within the plurality of openings of the baked resist pattern, wherein a top surface of the second resist layer is lower than a top surface of the baked resist pattern;
exposing the second resist layer according to a predefined pattern to form a plurality of exposed resist features and a plurality of unexposed resist features on the substrate; and
forming a second resist pattern by providing a solvent to remove the baked resist pattern and the exposed resist features, leaving the unexposed resist features on the substrate.

16. The method of claim 15, wherein the first positive resist pattern is baked at a temperature from about 100° C. to about 250° C.

17. The method of claim 15, wherein the first resist pattern is baked at a temperature from about 100° C. to about 250° C. for from about 20 sec to about 200 sec.

18. The method of claim 15, wherein the applying of the second resist layer comprises applying a spin-on coating process.

19. The method of claim 18, wherein the applying of the spin-on coating process comprises tuning spin speed to form the second positive resist layer thinner than that of the first positive resist pattern.

20. The method of claim 18, wherein the applying of the spin-on coating process provides the second positive resist layer with a tuned surface tension such that the second resist layer is thinner than that of the first positive resist pattern.

21. The method of claim 15, wherein the solvent is a developer solvent.

* * * * *